US011770933B2

(12) United States Patent
Kim et al.

(10) Patent No.: US 11,770,933 B2
(45) Date of Patent: Sep. 26, 2023

(54) MEMORY DEVICE INCLUDING ROW DECODER

(71) Applicant: SK hynix Inc., Icheon-si (KR)

(72) Inventors: Jin Ho Kim, Icheon-si (KR); Young Ki Kim, Icheon-si (KR); Sang Hyun Sung, Icheon-si (KR); Sung Lae Oh, Icheon-si (KR); Byung Hyun Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 425 days.

(21) Appl. No.: 17/165,097

(22) Filed: Feb. 2, 2021

(65) Prior Publication Data

US 2022/0077172 A1 Mar. 10, 2022

(30) Foreign Application Priority Data

Sep. 8, 2020 (KR) .................. 10-2020-0114973

(51) Int. Cl.
*H10B 43/40* (2023.01)
*H01L 23/522* (2006.01)
*H10B 41/27* (2023.01)
*H10B 41/41* (2023.01)
*H10B 43/27* (2023.01)

(52) U.S. Cl.
CPC ......... *H10B 43/40* (2023.02); *H01L 23/5226* (2013.01); *H10B 41/27* (2023.02); *H10B 41/41* (2023.02); *H10B 43/27* (2023.02)

(58) Field of Classification Search
CPC ....... H10B 43/40; H10B 41/41; H01L 23/528; H01L 23/5226; G11C 13/0028; G11C 16/08
See application file for complete search history.

(56) References Cited

U.S. PATENT DOCUMENTS

2015/0187642 A1* 7/2015 Batra ................ H01L 21/76898
257/774
2020/0152573 A1* 5/2020 Oh ......................... H10B 43/10

FOREIGN PATENT DOCUMENTS

KR 1020170125551 A 11/2017
KR 1020190015773 A 2/2019

* cited by examiner

*Primary Examiner* — Christopher A Johnson
*Assistant Examiner* — Gillian Annelise Randall

(57) ABSTRACT

A memory device includes a substrate defined with a first cell region and a second cell region, and a row decoder region between the first and second cell regions; a peripheral circuit defined in the first and second cell regions of the substrate; pass transistors defined in the row decoder region of the substrate; bottom wiring layers disposed in a first dielectric layer covering the peripheral circuit and the pass transistors; a memory cell array defined on the first dielectric layer; a second dielectric layer defined on the first dielectric layer, and covering the memory cell array; top wiring layers disposed in a third dielectric layer defined on the second dielectric layer; and global lines disposed in the row decoder region, and configured to transfer operating voltages to the pass transistors, wherein the global lines are disposed only in at least one bottom wiring layer from among the bottom and top wiring layers.

20 Claims, 13 Drawing Sheets

FIG.3
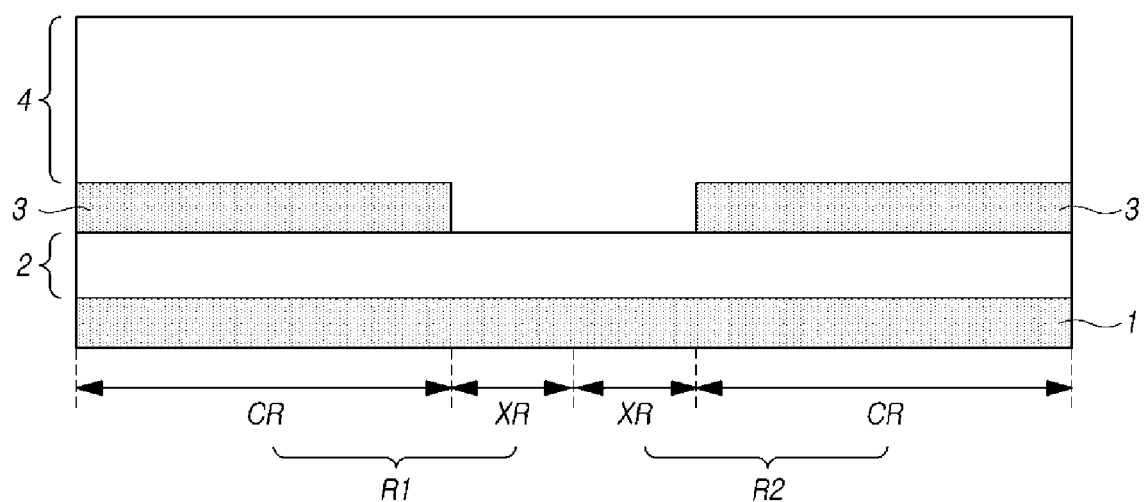
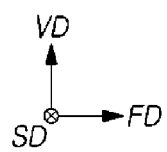

MEMORY DEVICE INCLUDING ROW DECODER

CROSS-REFERENCE TO RELATED APPLICATION

The present application claims priority under 35 U.S.C. § 119(a) to Korean Patent Application No. 10-2020-0114973 filed in the Korean Intellectual Property Office on Sep. 8, 2020, which is incorporated herein by reference in its entirety.

BACKGROUND

1. Technical Field

Various embodiments generally relate to a semiconductor technology, and more particularly, to a memory device that includes a row decoder.

2. Related Art

A volatile memory device has high write and read speeds, but may lose data stored therein if its power supply is interrupted. A nonvolatile memory device has relatively low write and read speeds, but may retain data stored therein even though its power supply is interrupted. Therefore, in order to store data that should be retained regardless of power supply, a nonvolatile memory device may be used. Examples of nonvolatile memory devices include a read only memory (ROM), a mask ROM (MROM), a programmable ROM (PROM), an erasable programmable ROM (EPROM), an electrically erasable and programmable ROM (EEPROM), a flash memory, a phase change random access memory (PRAM), a magnetic RAM (MRAM), a resistive RAM (RRAM), and a ferroelectric RAM (FRAM). Flash memories may be divided into NOR type and NAND type memories.

Among the examples of nonvolatile memory devices, a NAND flash memory device is widely used as a data storage device. The NAND flash memory device may transfer operating voltages to memory cells through a row decoder.

SUMMARY

Various embodiments are directed to measures capable of reducing the size and failure of a memory device.

In an embodiment, a memory device may include: a substrate defined with a first cell region and a second cell region, disposed in a first direction, and a row decoder region disposed between the first cell region and the second cell region; a peripheral circuit defined in the first and second cell regions of the substrate; a plurality of pass transistors defined in the row decoder region of the substrate; a plurality of bottom wiring layers disposed in a first dielectric layer, which covers the peripheral circuit and the plurality of pass transistors; a memory cell array defined on the first dielectric layer; a second dielectric layer, defined on the first dielectric layer that covers the memory cell array; a plurality of top wiring layers disposed in a third dielectric layer, which is defined on the second dielectric layer; and a plurality of global lines, disposed in the row decoder region, that transfer operating voltages to the plurality of pass transistors. The plurality of global lines are disposed only in a bottom wiring layer from among the plurality of bottom wiring layers and the plurality of top wiring layers.

In an embodiment, a memory device may include: a substrate, defined with a first plane region and a second plane region that are disposed in a first direction, and each of the first plane region and the second plane region includes a cell region and a row decoder region adjacent to the cell region in the first direction; a plurality of pass transistors defined in the row decoder regions of the first plane region and the second plane region of the substrate; a peripheral circuit defined in the cell regions of the first plane region and the second plane region of the substrate; a plurality of bottom wiring layers disposed in a first dielectric layer that covers the pass transistors and the peripheral circuit; a memory cell array of a first plane, which is disposed on the first dielectric layer and is provided in the cell region of the first plane region, and a memory cell array of a second plane, which is disposed on the first dielectric layer and is provided in the cell region of the second plane region; a second dielectric layer defined on the first dielectric layer, and covering the memory cell arrays; a plurality of top wiring layers disposed in a third dielectric layer, which is defined on the second dielectric layer; and a plurality of global lines disposed in the row decoder regions the first plane region and the second plane region and configured to transfer operating voltages to the plurality of pass transistors. The plurality of global lines may be disposed only in at least one bottom wiring layer among the plurality of bottom wiring layers and the plurality of top wiring layers.

BRIEF DESCRIPTION OF THE DRAWINGS

FIG. 3 is a cross-sectional view illustrating a representation of a schematic layout of a memory device in accordance with an embodiment of the disclosure.

DETAILED DESCRIPTION

Figure 1:
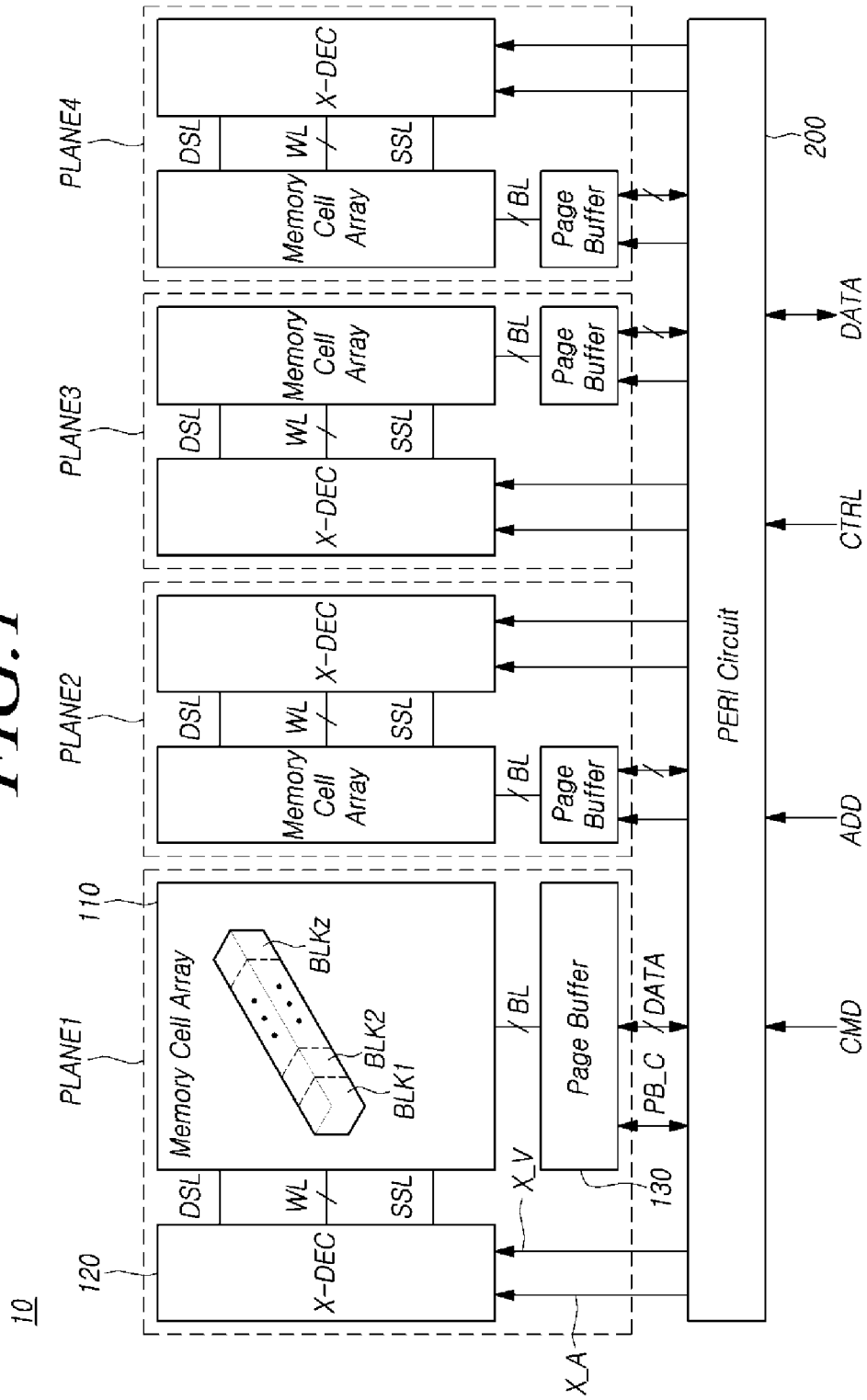
FIG. 1 is a block diagram illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a memory device in accordance with an embodiment of the disclosure.

Referring to FIG. 1, a memory device 10 in accordance with an embodiment of the disclosure may include a plurality of planes PLANE1 to PLANE4 and a peripheral circuit (PERI Circuit) 200. The memory device 10 may have a four-plane structure. While the embodiment of FIG. 1 illustrates a memory device 10 with four planes, it is to be noted that the number of planes included in the memory device 10 is not limited thereto.

Each of the planes PLANE1 to PLANE4 may be substantially the same and may include a memory cell array 110, a row decoder (X-DEC) 120 and a page buffer circuit (Page Buffer) 130.

The memory cell array 110 may include a plurality of memory blocks BLK1 to BLKz (where z is a natural number of 2 or more). Each of the memory blocks BLK1 to BLKz may be coupled to the row decoder 120 through at least one drain select line DSL, a plurality of word lines WL and at least one source select line SSL. The memory blocks BLK1 to BLKz may be coupled to the page buffer circuit 130 through a plurality of bit lines BL. The drain select line DSL, the word lines WL and the source select line SSL may be provided for each of the memory blocks BLK1 to BLKz, and the bit lines BL may be provided in common for the memory blocks BLK1 to BLKz.

Each of the memory blocks BLK1 to BLKz may include a plurality of cell strings. Although not illustrated, each of the cell strings may include, coupled in series, at least one drain select transistor, a plurality of memory cells, and at least one source select transistor.

The row decoder 120 may select any one from among the memory blocks BLK1 to BLKz included in the memory cell array 110, in response to a row address X_A provided from the peripheral circuit 200. The row decoder 120 may transfer an operating voltage X_V, provided from the peripheral circuit 200, to the drain select line DSL, the word lines WL and the source select line SSL, which are coupled to a selected memory block.

The page buffer circuit 130 may include a plurality of page buffers (not illustrated) that are coupled to the plurality of bit lines BL, respectively. The page buffer may receive a page buffer control signal PB_C from the peripheral circuit 200, and may transmit and receive a data signal DATA to and from the peripheral circuit 200. The page buffer may control the bit line BL in response to the page buffer control signal PB_C. For example, the page buffer may detect data, stored in a memory cell of the memory cell array 110, by sensing a signal of the bit line BL in response to the page buffer control signal PB_C, and may transmit the data signal DATA to the peripheral circuit 200 depending on the detected data. The page buffer may apply a signal to the bit line BL, based on the data signal DATA received from the peripheral circuit 200, in response to the page buffer control signal PB_C, and thereby, may write data to a memory cell of the memory cell array 110. The page buffer may write data to or read data from a memory cell that is coupled to an activated word line WL.

The peripheral circuit 200 may receive a command signal CMD, an address signal ADD and a control signal CTRL from outside the memory device 10, and may transmit and receive data DATA to and from a device outside the memory device 10, for example, a memory controller. The peripheral circuit 200 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit 200 may generate various voltages, including the operating voltage X_V, which are required in the memory device 10.

Although, in the present specification, a case where the memory device 10 is a flash memory is described as an example, in other embodiments, the type of a memory is not limited thereto, and the disclosure may also be applied to other memories in addition to flash memories. For example, a memory may be any one from among a dynamic random access memory (DRAM), a phase change RAM (PRAM), a magnetic RAM (MRAM), a resistive RAM (RRAM) and an ferroelectric RAM (FRAM).

Figure 2:
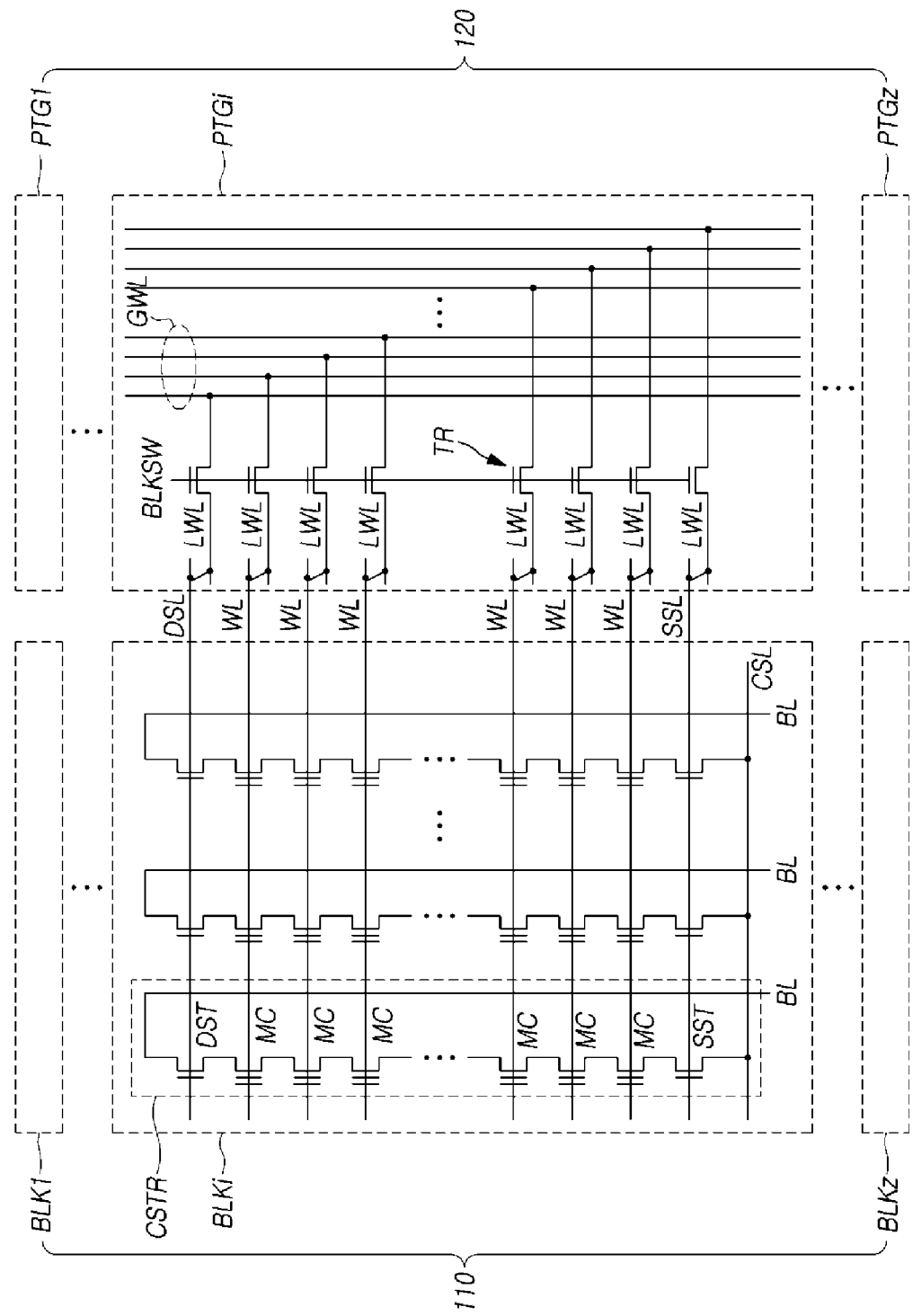
FIG. 2 is a circuit diagram illustrating a representation of a memory cell array and a row decoder illustrated in FIG. 1.

FIG. 2 is a circuit diagram illustrating a representation of a memory cell array and a row decoder illustrated in FIG. 1.

Referring to FIG. 2, a memory cell array 110 included in each of a plurality of planes PLANE1 to PLANE4 may include a plurality of memory blocks BLK1 to BLKz. Each of the memory blocks BLK1 to BLKz may correspond to an erase unit when a memory device performs an erase operation.

Each of the memory blocks BLK1 to BLKz may include a plurality of cell strings CSTR, which are coupled between a plurality of bit lines BL and a common source line CSL. As illustrated in FIG. 2, in a memory block BLKi, each of the cell strings CSTR may include a drain select transistor DST, which is coupled to a bit line BL, a source select transistor SST, which is coupled to a common source line CSL, and a plurality of memory cells MC, which are coupled in series between the drain select transistor DST and the source select transistor SST.

The plurality of cell strings CSTR included in each of the memory blocks BLK1 to BLKz may be coupled in common to the common source line CSL. Each of the cell strings CSTR may be coupled to a corresponding bit line BL.

The gates of drain select transistors DST may be coupled to a drain select line DSL. The gates of each of memory cells MC may be coupled to a corresponding word line WL. The gates of source select transistors SST may be coupled to a source select line SSL. The drain select line DSL, the word lines WL and the source select line SSL may be coupled to local lines LWL, respectively.

A row decoder 120 may include a plurality of pass transistor groups PTG1 to PTGz corresponding to the memory blocks BLK1 to BLKz, respectively. Each of the plurality of pass transistor groups PTG1 to PTGz may include a plurality of pass transistors TR, which are coupled between global lines GWL and the local lines LWL. The pass transistors TR may transfer operating voltages, applied to the global lines GWL, to a corresponding memory block through the local lines LWL in response to a block select signal BLKSW. The local lines LWL may be provided for each of the pass transistor groups PTG1 to PTGz, and the global lines GWL may be provided in common for the pass transistor groups PTG1 to PTGz. Thus, the pass transistor groups PTG1 to PTGz may share the global lines GWL.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines, and the second direction SD may correspond to the extending direction of bit lines. The first direction FD and the second direction SD may substantially perpendicularly intersect with each other. In the drawings, a direction indicated by an arrow and a direction opposite thereto represent the same direction.

FIG. 3 is a cross-sectional view illustrating a representation of a schematic layout of a memory device in accordance with an embodiment of the disclosure.

Referring to FIG. 3, a memory device 10 in accordance with an embodiment of the disclosure may have a PUC (peri under cell) structure. The memory device 10 may include a substrate 1, a logic structure 2 that is disposed on the substrate 1, source plates 3 that are disposed on the logic structure 2, and a memory structure 4 that is disposed on the logic structure 2 and the source plates 3.

The substrate 1 of the memory device 10 may include a first plane region R1 and a second plane region R2, which are disposed in the first direction FD. Each of the first and second plane regions R1 and R2 may include a cell region CR and a row decoder region XR that is adjacent to the respective cell region CR in the first direction FD.

As will be described later, the logic structure 2 may include row decoders, page buffer circuits, and a peripheral circuit. Further, the logic structure 2 may include a plurality of bottom wiring layers, which are positioned at different height levels.

The source plates 3 may be disposed in the cell region CR of the first plane region R1 and the cell region CR of the second plane region R2, respectively.

As will be described later, the memory structure 4 may include memory cell arrays that are disposed on the source plates 3, respectively, and a plurality of top wiring layers, which are positioned at different height levels. FIG. 3 illustrates a structure that includes two planes. The memory cell array that is disposed in the first plane region R1 may configure a first plane, and the memory cell array that is disposed in the second plane region R2 may configure a second plane.

Figure 4:
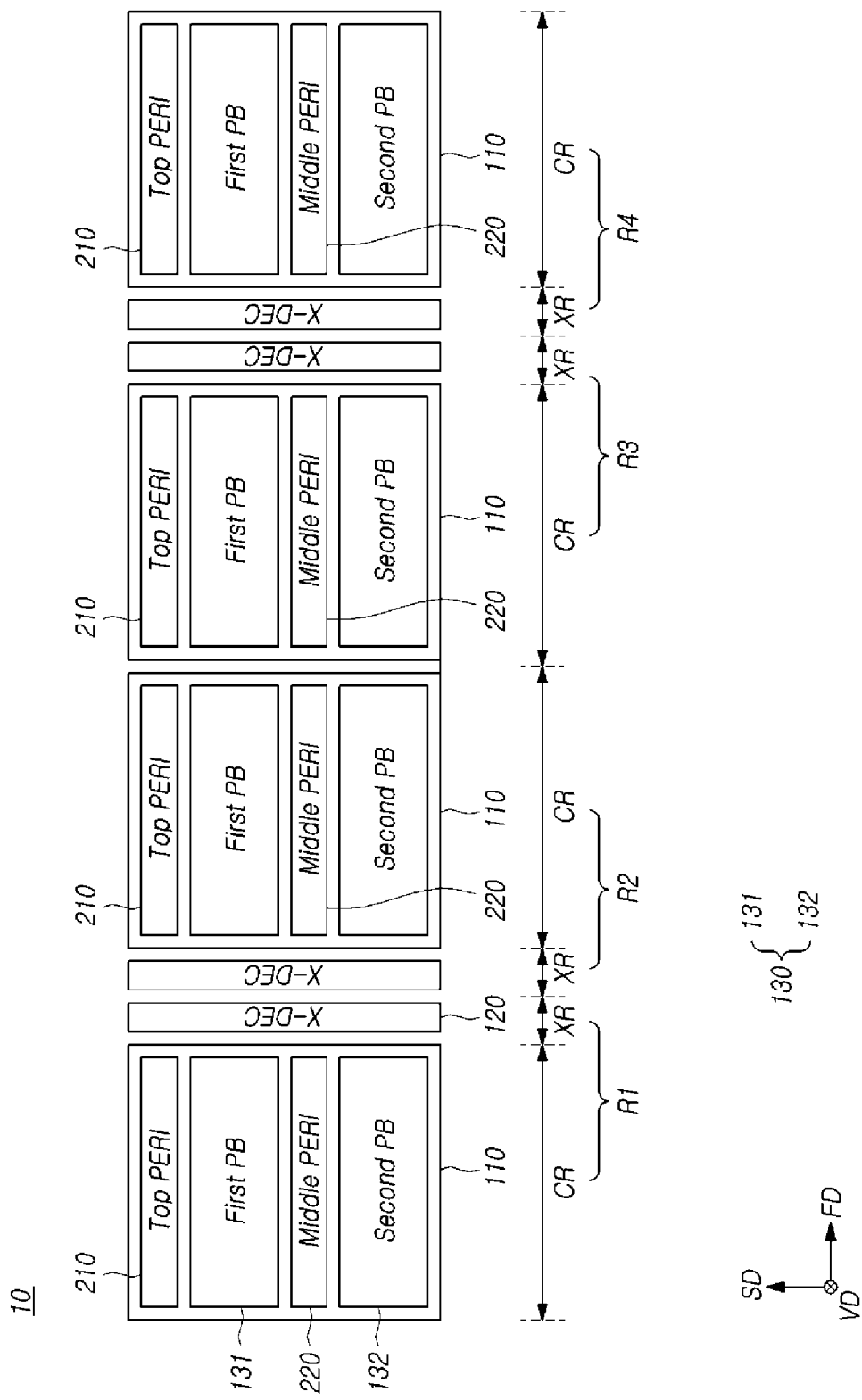
FIG. 4 is a top view illustrating a representation of a layout of a memory device in accordance with an embodiment of the disclosure.

FIG. 4 is a top view illustrating a representation of a layout of a memory device in accordance with an embodiment of the disclosure.

Referring to FIG. 4, a memory device 10 may include a plurality of plane regions R1 to R4. For instance, FIG. 4 illustrates a case including four plane regions, which are disposed in a line in the first direction FD. For the sake of convenience in explanation, the plane regions R1 to R4 will be defined as first to fourth plane regions R1 to R4. Each of the first to fourth plane regions R1 to R4 may include a cell region CR and a row decoder region, XR which is adjacent to the cell region CR in the first direction FD.

A memory cell array 110, a row decoder 120 and a page buffer circuit 130 may be disposed in each of the first to fourth plane regions R1 to R4. The memory cell array 110, the row decoder 120 and the page buffer circuit 130, which are included in each of the first to fourth plane regions R1 to R4, may configure one plane.

The memory cell array 110 may be disposed in the cell region CR. The row decoder 120 may be disposed in the row decoder region XR. The page buffer circuit 130 may be disposed in the cell region CR to overlap with the memory cell array 110 in the vertical direction VD.

As described above with reference to FIG. 2, operating voltages may be transferred to the word lines of the memory cell array 110 through the pass transistors of the row decoder 120. In order to reduce a delay time caused in the process of transferring the operating voltages, the row decoder 120 may be disposed to have a shape extending in the second direction SD, as a direction in which the word lines are arranged, and may be disposed to have a length substantially the same as or similar to that of the memory cell array 110 in the second direction SD.

In each of the first to fourth plane regions R1 to R4, the page buffer circuit 130 may be disposed by being divided into a first page buffer region (First PB) 131 and a second page buffer region (Second PB) 132. The first page buffer region 131 and the second page buffer region 132 may be arranged in the second direction SD.

In order to reduce a delay time of a signal, applied to bit lines by the page buffer circuit 130 or provided to the page buffer circuit 130 through the bit lines, the first page buffer region 131 and the second page buffer region 132 each may have a length substantially the same as or similar to that of the memory cell array 110 in the first direction FD, as a direction in which the bit lines are arranged.

A peripheral circuit may be disposed by being divided into a plurality of peripheral regions 210 and 220. The peripheral regions 210 and 220 may include a plurality of first peripheral regions (Top PERI) 210 and a plurality of second peripheral regions (Middle PERI) 220. One first peripheral region 210 and one second peripheral region 220 may be disposed in the cell region CR of each of the first to fourth plane regions R1 to R4 to overlap with the memory cell array 110 in the vertical direction VD.

In a single cell region CR, the second peripheral region 220 may be disposed between the first page buffer region 131 and the second page buffer region 132. The first peripheral region 210 may be disposed on a side of the first page buffer region 131 opposite to the side adjacent to the second peripheral region 220. Thus, the first peripheral region 210 and the second peripheral region 220, which are disposed in the single cell region CR, may be positioned on both sides, respectively, of the first page buffer region 131, which has a length substantially the same as or similar to that of the memory cell array 110 in the first direction FD.

The first peripheral region 210 of the first plane region R1 and the first peripheral region 210 of the second plane region R2 may be arranged in the first direction FD on opposite sides of the pair of the row decoder 120 of the first plane region R1 and the row decoder 120 of the second plane region R2. The row decoder 120 of the first plane region R1 and the row decoder 120 of the second plane region R2 may each have a length substantially the same as or similar to that of the memory cell array 110 in the second direction SD. The second peripheral region 220 of the first plane region R1 and the second peripheral region 220 of the second plane region R2 may also be positioned, in the first direction FD, on both sides of the pair of the row decoder 120 of the first plane region R1 and the row decoder 120 of the second plane region R2.

The first peripheral region 210 of the third plane region R3 and the first peripheral region 210 of the fourth plane region R4 may be arranged in the first direction FD on opposite sides of the pair of the row decoder 120 of the third plane region R3 and the row decoder 120 of the fourth plane region R4. The row decoder 120 of the third plane region R3 and the row decoder 120 of the fourth plane region R4 may each have a length substantially the same as or similar to that of the memory cell array 110 in the second direction SD. The second peripheral region 220 of the third plane region R3 and the second peripheral region 220 of the fourth plane region R4 may also be positioned, in the first direction FD, on both sides of the pair of the row decoder 120 of the third plane region R3 and the row decoder 120 of the fourth plane region R4.

Although not illustrated, elements that configure a peripheral circuit may be coupled to one another through coupling lines. The coupling lines may include power lines that serve to transmit power such as a power voltage and a ground voltage, analog signal lines that serve to transmit analog signals, and logic signal lines that serve to transmit logic signals such as data, commands and addresses.

In order to couple elements that configure the peripheral circuit disposed in the plurality of peripheral regions 210 and 220, some of the coupling lines may have shapes extending in the second direction SD, and some of the coupling lines may have shapes extending in the first direction FD.

As described above with reference to FIG. 2, each of the row decoders 120 may include a plurality of pass transistors. The pass transistors may serve to transfer operating voltages, applied to global lines (GWL of FIG. 2), to the memory cell array 110. Although not illustrated, the global lines may extend in the second direction SD, and may be disposed to overlap with the pass transistors of the row decoder 120 in the vertical direction VD.

As described above, because the global lines extending in the second direction SD are disposed over the pass transistors of the row decoders 120, disposing the coupling lines to avoid the global lines becomes more difficult or complicated.

For example, if a plane area is increased or a wiring layer is added for the disposition of the coupling lines, it may be possible to dispose the coupling lines independent of the positions of the global lines. However, if a plane area is increased or a wiring layer is added, the size of the memory device 10 will increase.

Embodiments of the disclosure may enable the disposition of coupling lines without increasing the size of a memory device.

Figure 5:
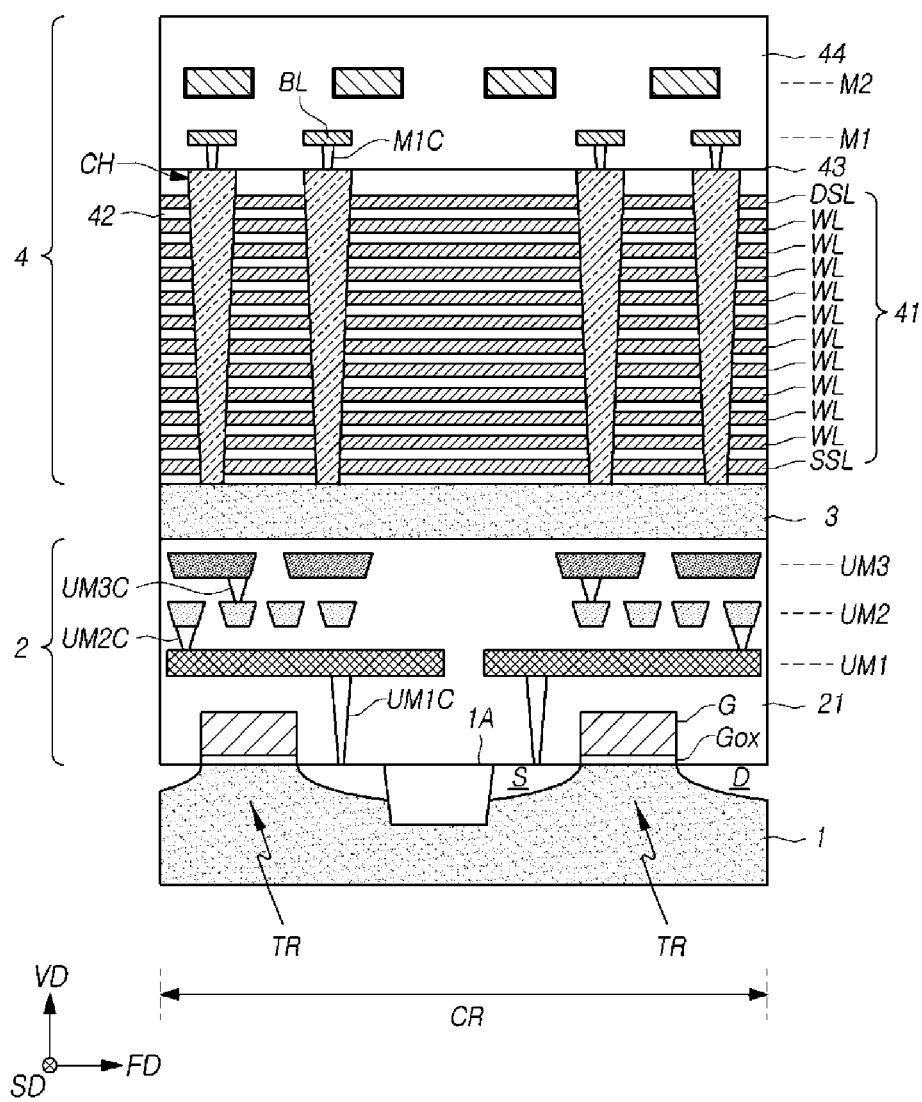
FIGS. 5 and 6 are cross-sectional views illustrating a representation of a memory device in accordance with an embodiment of the disclosure.
Figure 6:
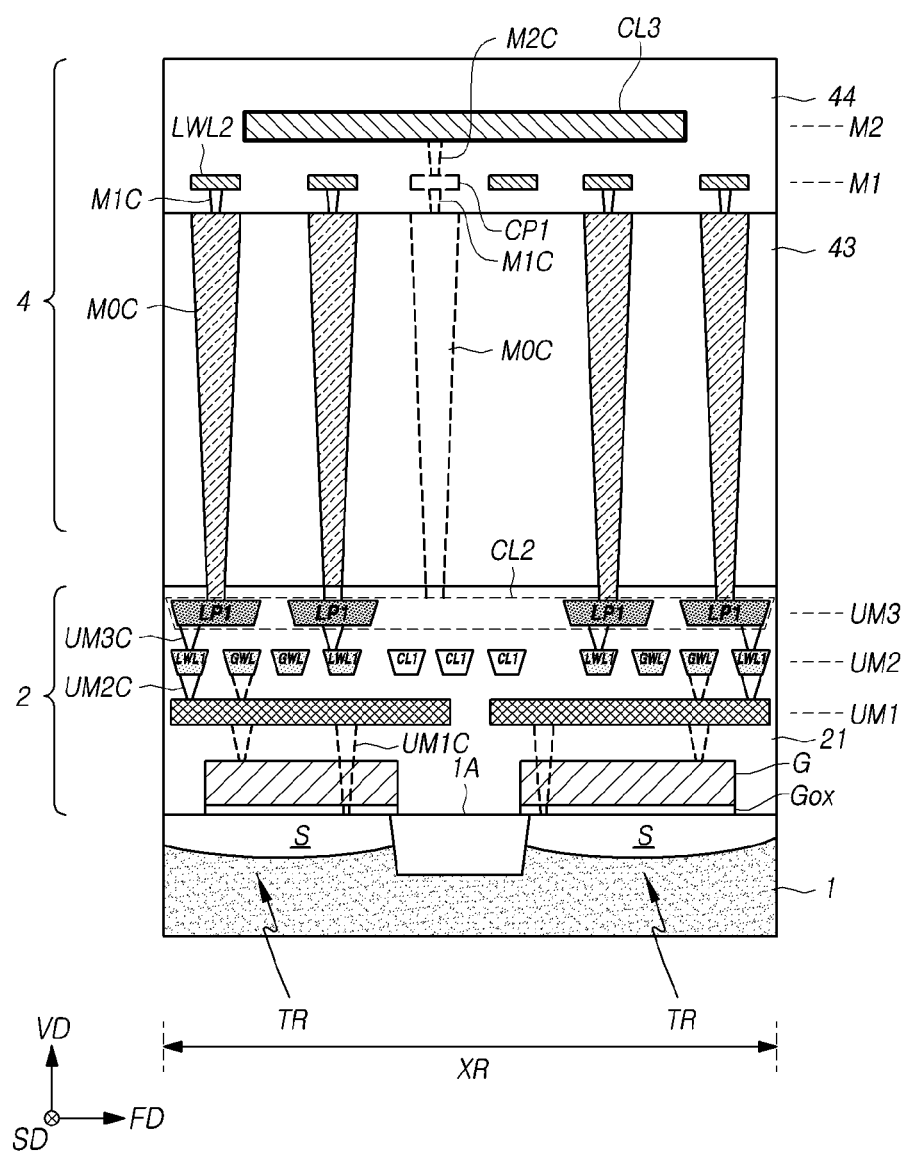

FIGS. 5 and 6 are cross-sectional views illustrating a representation of a memory device in accordance with an embodiment of the disclosure.

FIG. 5 is a cross-sectional view illustrating a cell region CR, and FIG. 6 is a cross-sectional view illustrating a row decoder region XR. Components indicated by dotted lines in FIG. 6 are illustrated to facilitate understanding, and are not actually disposed on the cross-section of FIG. 6.

Referring to FIGS. 5 and 6, a substrate 1 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

A logic structure 2 may include a plurality of transistors TR, which are defined in active regions of the substrate 1 defined by an isolation layer 1A, a plurality of bottom wiring layers UM1 to UM3, and a plurality of contacts UM1C to UM3C.

A transistor TR may include a gate dielectric layer Gox that is defined on the substrate 1, a gate electrode G that is defined on the gate dielectric layer Gox, and junction regions, which are formed by implanting impurity ions into the active region on both sides of the gate electrode G. One of the junction regions may be used as a source region S of the transistor TR, and the other may be used as a drain region D of the transistor TR. The transistor TR may configure any one of a row decoder, a page buffer circuit and a peripheral circuit.

A dielectric layer 21 may be defined on the substrate 1 to cover the transistors TR. The dielectric layer 21 may include silicon oxide, for example, HDP (high density plasma) oxide or TEOS (tetra-ethyl-ortho-silicate) oxide.

The plurality of bottom wiring layers UM1 to UM3 may be disposed in the dielectric layer 21. For example, the bottom wiring layers UM1 to UM3 may include a first bottom wiring layer UM1, a second bottom wiring layer UM2 over the first bottom wiring layer UM1, and a third bottom wiring layer UM3 over the second bottom wiring layer UM2. While FIGS. 5 and 6 illustrate three bottom wiring layers UM1 to UM3, it is to be noted that the disclosure is not limited thereto. The number of wiring layers may be four or more.

A plurality of wiring line patterns may be disposed in each of the bottom wiring layers UM1 to UM3. The wiring line patterns of the bottom wiring layers UM1 to UM3 may be configured to have properties that may not exhibit a process failure, for example, a hillock, at a maximum temperature (hereinafter, referred to as 'process critical temperature'), during a process of forming a memory cell array. In other words, as a material for the wiring line patterns of the bottom wiring layers UM1 to UM3, a conductive material that has a heat resistance characteristic at the process critical temperature may be used. For example, the wiring line patterns of the bottom wiring layers UM1 to UM3 may include a material that has a melting point higher than the process critical temperature, such as tungsten (W). Because the wiring line patterns of the bottom wiring layers UM1 to UM3 are formed before the memory cell array is formed, the wiring line patterns are formed of a conductive material that has a high resistivity and has a high melting point.

The wiring line patterns of the second bottom wiring layer UM2 may include a plurality of first local lines LWL1, a plurality of global lines GWL and a plurality of first coupling lines CL1. The wiring line patterns of the third bottom wiring layer UM3 may include a plurality of first local pads LP1 and a plurality of second coupling lines CL2 (not illustrated in detail). The plurality of first local lines LWL1, the plurality of global lines GWL, the plurality of first coupling lines CL1 and the plurality of first local pads LP1 may be disposed in the row decoder region XR. Although not illustrated in detail, the plurality of second coupling lines CL2 may traverse the row decoder region XR in the first direction FD, and an end of each of the plurality of second coupling lines CL2 may be disposed in the cell region CR.

The contact UM1C may be defined between the first bottom wiring layer UM1 and the transistor TR, and may couple a wiring line pattern of the first bottom wiring layer UM1 and the transistor TR. The contact UM2C may be defined between the second bottom wiring layer UM2 and the first bottom wiring layer UM1, and may couple a wiring line pattern of the second bottom wiring layer UM2 and a wiring line pattern of the first bottom wiring layer UM1. The contact UM3C may be defined between the third bottom wiring layer UM3 and the second bottom wiring layer UM2, and may couple a wiring line pattern of the third bottom wiring layer UM3 and a wiring line pattern of the second bottom wiring layer UM2.

A source plate 3 may be configured to be disposed on the dielectric layer 21 of the cell region CR and to expose the dielectric layer 21 of the row decoder region XR. The source plate 3 may be formed as a polysilicon layer. Unlike the substrate 1, which may use a monocrystalline silicon layer, the source plate 3 may be formed as a polysilicon layer on the dielectric layer 21 of the logic structure 2.

A memory structure 4 may include a plurality of electrode layers 41 and a plurality of interlayer dielectric layers 42, which are alternately stacked on the source plate 3, a plurality of vertical channels CH, which pass through the plurality of electrode layers 41 and the plurality of interlayer dielectric layers 42, a plurality of top wiring layers M1 and M2, and contacts M0C, M1C and M2C.

The electrode layers 41 may include a conductive material. For example, the electrode layers 41 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 41, at least one electrode layer 41 from the lowermost electrode layers 41 may configure a source select line SSL. Among the electrode layers 41, at least one electrode layer 41 from the uppermost electrode layers 41 may configure a drain select line DSL. The electrode layers 41 between the source select line SSL and the drain select line DSL may configure word lines WL.

Each of the vertical channels CH may include a channel layer and a gate dielectric layer. The channel layer may include polysilicon or monocrystalline silicon, and may include, in some regions thereof, a p-type impurity such as boron (B). The channel layer may have the shape of a pillar that is completely filled up to its center, or a solid cylinder. While not illustrated, the channel layer may have the shape of a tube whose center region is open. In this case, a buried dielectric layer may be formed in the open center region of the channel layer. The gate dielectric layer may have the shape of a straw or a cylindrical shell that surrounds the outer wall of the channel layer. Although not illustrated, the gate dielectric layer may include a tunnel dielectric layer, a charge storage layer and a blocking layer, which are sequentially stacked from the outer wall of the channel layer. The gate dielectric layer may have an ONO (oxide-nitride-oxide) stack structure in which an oxide layer, a nitride layer and an oxide layer are sequentially stacked.

A source select transistor may be formed in areas or regions where the source select line SSL surrounds the vertical channel CH. A drain select transistor may be formed in areas or regions where the drain select line DSL surrounds the vertical channel CH. A memory cell may be formed in areas or regions where the word line WL surrounds the vertical channel CH.

A dielectric layer 43 may be defined on the logic structure 2 to cover the source plate 3, the top surfaces and side surfaces of the plurality of electrode layers 41 and the plurality of interlayer dielectric layers 42, which are alternately stacked, and the side surfaces of the plurality of vertical channels CH. In the row decoder region XR, a plurality of contacts M0C pass through the dielectric layer 43 in the vertical direction VD and may be coupled respectively to the plurality of first local pads LP1 and to at least one second coupling line CL2.

A dielectric layer 44 may be defined on the dielectric layer 43. The plurality of top wiring layers M1 and M2 may be disposed in the dielectric layer 44. For example, the top wiring layers M1 and M2 may include a first top wiring layer M1 and a second top wiring layer M2 over the first top wiring layer M1. Each of the top wiring layers M1 and M2 may include a plurality of wiring line patterns.

The wiring line patterns of the top wiring layers M1 and M2 may be formed of a conductive material that has a lower resistivity than the wiring line patterns of the bottom wiring layers UM1 to UM3. For example, the wiring line patterns of the top wiring layers M1 and M2 may include at least one of aluminum (Al) and copper (Cu). Because the wiring line patterns of the top wiring layers M1 and M2 are formed after the memory cell array is formed, they may be formed of a material that may cause a process failure at the process critical temperature due to a low melting point thereof and that has a low resistivity.

Contacts M1C may be defined on the contacts M0C and the vertical channels CH. The wiring line patterns of the first top wiring layer M1 may include bit lines BL, second local lines LWL2 and a coupling pad CP1. The bit lines BL may be disposed in the cell region CR, extend in the second direction SD, and arranged in the first direction FD. Each of the bit lines BL may be coupled to a corresponding vertical channel CH through the contact M1C.

The second local lines LWL2 and the coupling pad CP1 may be disposed in the row decoder region XR. Each of the second local lines LWL2 and the coupling pad CP1 may be coupled to a corresponding contact M0C through a contact M1C.

A plurality of contacts M2C may be defined between the first top wiring layer M1 and the second top wiring layer M2. Each of the plurality of contacts M2C may couple a wiring line pattern of the first top wiring layer M1 and a corresponding wiring line pattern of the second top wiring layer M2. The second top wiring layer M2 may include a third coupling line CL3. The third coupling line CL3 may be coupled to the coupling pad CP1 through the contact M2C.

FIGS. 7A to 7E are top views illustrating representations of main components of a memory device in accordance with an embodiment of the disclosure, and illustrate the row decoder region XR.

Figure 7A:
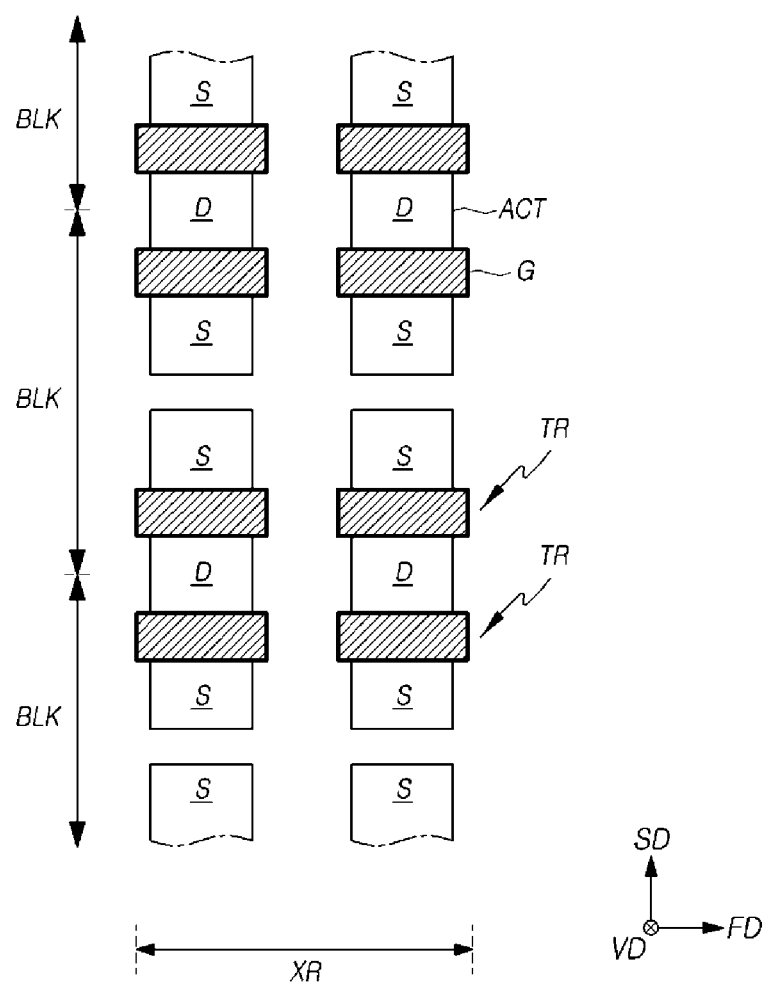
FIGS. 7A to 7E are top views illustrating representations of main components of a memory device in accordance with an embodiment of the disclosure.
Figure 7B:
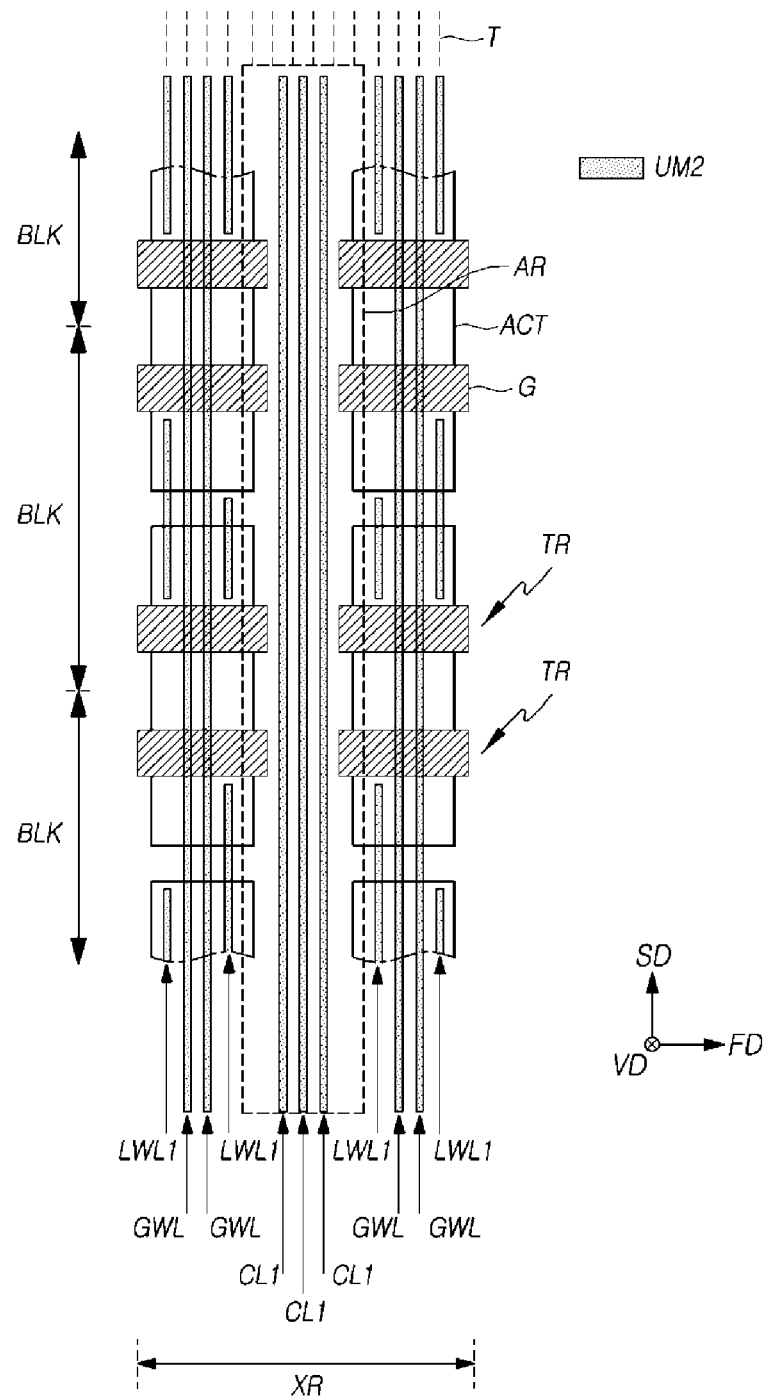
Figure 7C:
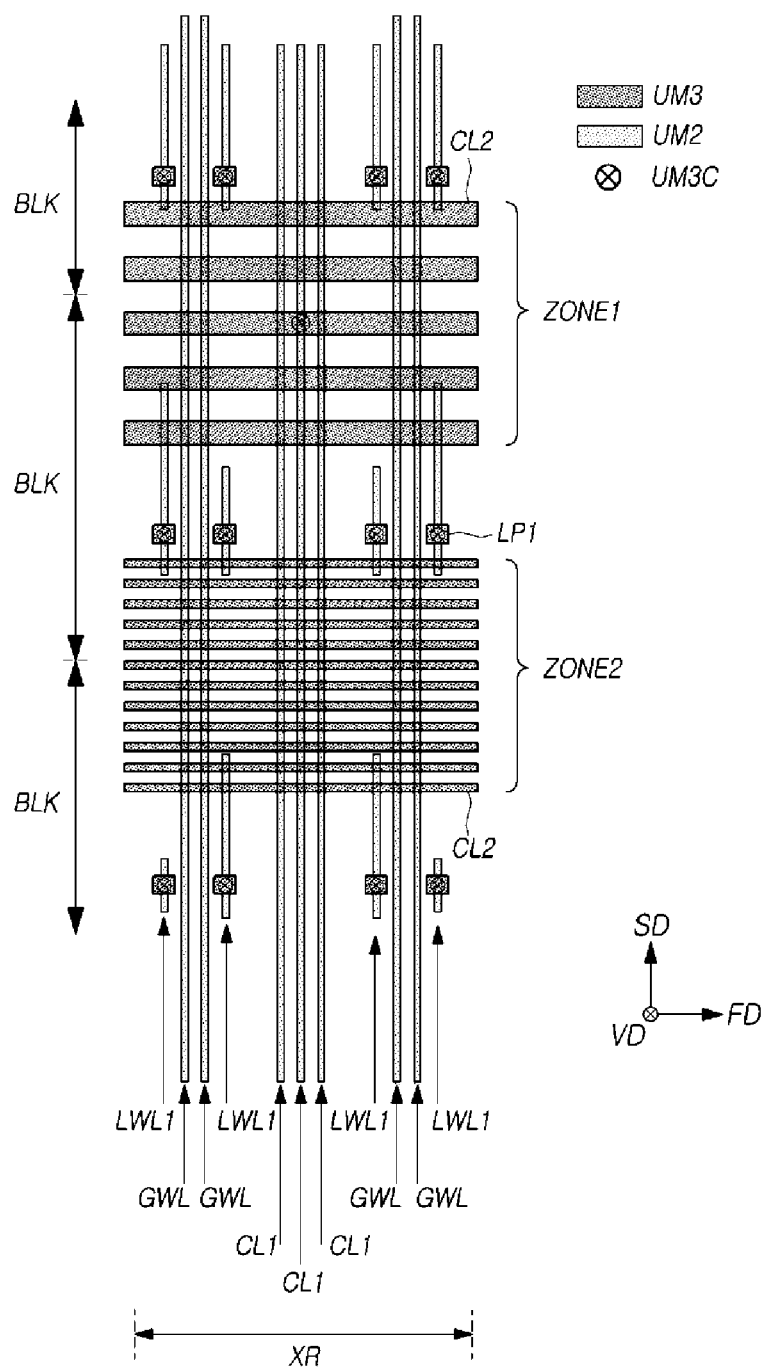
Figure 7D:
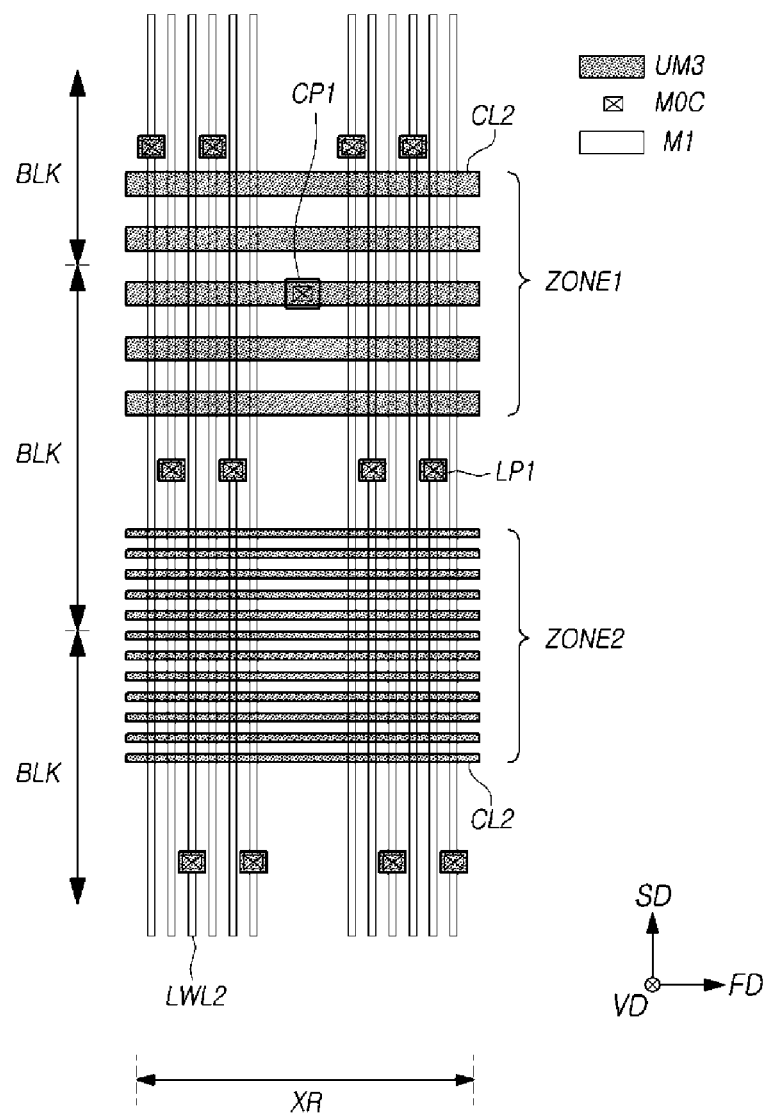
Figure 7E:
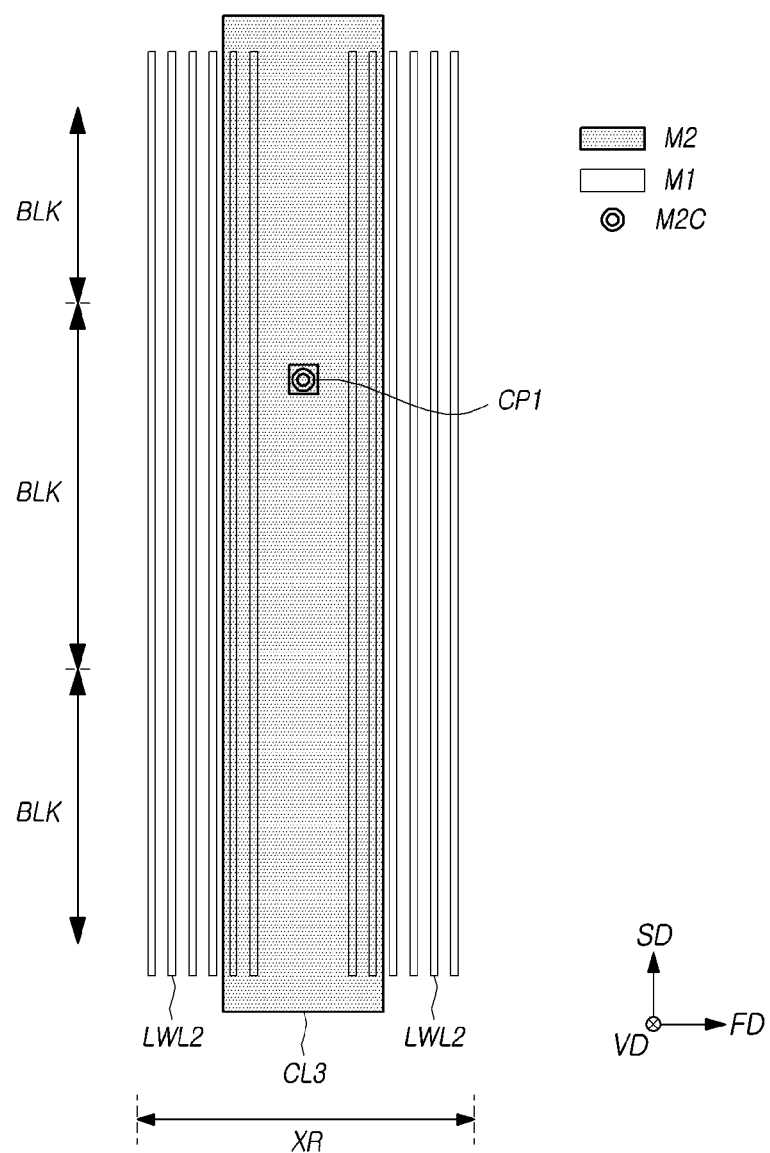

In detail, FIG. 7A is a top view illustrating pass transistors TR of a row decoder; FIG. 7B is a top view illustrating pass transistors TR and a second bottom wiring layer UM2; FIG. 7C is a top view illustrating a second bottom wiring layer UM2, a third bottom wiring layer UM3 and contacts UM3C; FIG. 7D is a top view illustrating a third bottom wiring layer UM3, a first top wiring layer M1 and contacts M0C; and FIG. 7E is a top view illustrating a first top wiring layer M1, a second top wiring layer M2 and contact M2C.

Referring to FIGS. 6 and 7A, a plurality of active regions ACT may be formed in the row decoder region XR of the substrate 1. In each of the active regions ACT, one drain region D and two source regions S, which are doped into a first conductivity type, and two channel regions (not illustrated) between the drain region D and source regions S, which are doped into a second conductivity type may be defined. The drain region D may be disposed, in the second direction SD, at a center portion of the active region ACT. The two source regions S may be disposed at both end portions, respectively, of the active region ACT in the second direction SD. Each of the channel regions may be disposed between a drain region D and an adjacent source region S. The gate electrode G may be formed over each channel region with the gate dielectric layer Gox interposed therebetween. Gate electrodes G may include a conductive material such as polysilicon. Two pass transistors TR that share one drain region D may be configured in each of the active regions ACT. The two pass transistors TR that share one drain region D may be coupled to different memory blocks BLK, respectively. Pass transistors TR of different active regions ACT, which are coupled to one memory block BLK, may be disposed in two rows that are adjacent to each other in the second direction SD.

Although the present embodiment illustrates two pass transistors TR in one active region ACT, it is to be noted that the disclosure is not limited thereto. For example, one pass transistor TR may be configured in one active region ACT.

Although the present embodiment illustrates pass transistors TR, which are coupled to one memory block BLK, disposed in two rows, it is to be noted that the disclosure is not limited thereto. Pass transistors TR that are coupled to one memory block BLK may be disposed in one row or at least three rows, for example.

Referring to FIGS. 6 and 7B, the plurality of first local lines LWL1, the plurality of global lines GWL and the plurality of first coupling lines CL1 may be disposed in the second bottom wiring layer UM2 of the row decoder region XR.

A plurality of wiring line tracks T, which extend in the second direction SD and are arranged at regular intervals in the first direction FD, may be defined in the second bottom wiring layer UM2. The plurality of wiring line tracks T may be lines that serve as references in disposing the first local lines LWL1, the global lines GWL and the first coupling lines CL1. The first local lines LWL1, the global lines GWL and the first coupling lines CL1 may be aligned with the wiring line tracks T, and the center line of each of the first local lines LWL1, the global lines GWL and the first coupling lines CL1 may overlap with a corresponding wiring line track T.

The global lines GWL may extend in the second direction SD, and may each overlap with corresponding pass transistors TR in the vertical direction VD. Each of the plurality of global lines GWL may be coupled to the drain regions D (see FIG. 7A) of the corresponding pass transistors TR through the contact UM2C (see FIG. 6), the wiring line pattern of the first bottom wiring layer UM1 (see FIG. 6) and the contact UM1C (see FIG. 6). The second bottom wiring layer UM2 may correspond to an uppermost wiring layer that is used in disposing global lines. Although the present embodiment illustrates global lines disposed in one bottom wiring layer, it is to be noted that the disclosure is not limited thereto. The global lines may be disposed in at least one of remaining bottom wiring layers, except for the third bottom wiring layer UM3.

The first local lines LWL1 may extend in the second direction SD, and may each overlap with the source region S of a corresponding pass transistor TR in the vertical direction VD. Each of the plurality of first local lines LWL1 may be coupled to the source region S (see FIG. 6) of a corresponding pass transistor TR through the contact UM2C (see FIG. 6), the wiring line pattern of the first bottom wiring layer UM1 (see FIG. 6), and the contact UM1C (see FIG. 6).

Each of the plurality of first local lines LWL1 may be disposed within a width of a corresponding memory block BLK in the second direction SD. A plurality of first local lines LWL1 corresponding to different memory blocks BLK may be disposed in one wiring line track T. That is to say, a plurality of first local lines LWL1 corresponding to different memory blocks BLK may share one wiring line track T.

In the second bottom wiring layer UM2, there may exist wiring line tracks T that are not used for disposing the global lines GWL and the first local lines LWL1. A region AR of FIG. 7B may correspond to a region where wiring line tracks T are positioned that are not used for disposing the global lines GWL and the first local lines LWL1. The wiring line tracks T of the region AR may be used for the first coupling lines CL1.

Referring to FIGS. 6 and 7C, a plurality of second coupling lines CL2 and a plurality of first local pads LP1 may be disposed in the third bottom wiring layer UM3. The first local pads LP1 corresponding to one memory block BLK may be disposed in one row within the width of the corresponding memory block BLK. The plurality of first local pads LP1 may be disposed in a plurality of rows in the second direction SD corresponding to the plurality of memory blocks BLK disposed in the second direction SD. The first local pads LP1 may be coupled to the corresponding first local lines LWL1 through the contact UM3C (see FIG. 6).

A first zone ZONE1 and a second zone ZONE2, which are separated by a row of the first local pads LP1 may be defined. The first zone ZONE1 and the second zone ZONE2 may be disposed in the second direction SD. Although not illustrated, a plurality of first zones ZONE1 and a plurality of second zones ZONE2 may be alternately arranged in the second direction SD.

The second coupling lines CL2 may be disposed in the first zone ZONE1 and the second zone ZONE2, and may have line shapes that extend in the first direction FD. In the second direction SD, a width of the second coupling lines CL2 disposed in the first zone ZONE1 may be larger than a width of the second coupling lines CL2 disposed in the second zone ZONE2.

Due to the resistance components of the second coupling lines CL2, the magnitudes of signals may decrease during a process in which the signals are transferred through the second coupling lines CL2. The second coupling lines CL2 of the first zone ZONE1 may be used to transmit a signal that has a high possibility of causing a functional error of the memory device when the magnitude thereof decreases, for example, power and analog signals. The second coupling lines CL2 of the second zone ZONE2 may be used to transmit a signal that has a low possibility of causing a functional error of the memory device even when the magnitude thereof decreases and requires a large number of lines, for example, a logic signal that only needs to be distinguished between a logic high and a logic low.

It is not necessary to configure pads that are coupled to the global lines GWL in the third bottom wiring layer UM3 because the second bottom wiring layer UM2 is an uppermost wiring layer that is used in disposing global lines. For this reason, no pads that are coupled to the global lines GWL exist in the third bottom wiring layer UM3.

Unlike the present embodiment, in cases where pads that are coupled to global lines exist in a third bottom wiring layer, the number of pads disposed in the third bottom wiring layer increases, and the number of rows of the pads increases. Thus, the number of second coupling lines capable of being disposed in the third bottom wiring layer may decrease. In contrast, according to the present embodiment, no pads that are coupled to the global lines GWL exist in the third bottom wiring layer UM3, so the number of pads disposed in the third bottom wiring layer UM3 may be reduced, and the number of rows of the pads may be reduced. Thus, the number of second coupling lines capable of being disposed in the third bottom wiring layer UM3 may be increased.

Referring to FIGS. 6 and 7D, a plurality of second local lines LWL2 and a coupling pad CP1 may be disposed in the first top wiring layer M1.

The second local lines LWL2 may extend in the second direction SD, and may each overlap with a corresponding first local pad LP1 in the vertical direction VD. The contact M1C (see FIG. 6) and the contact M0C may be disposed in the vertical direction VD at an overlapping region between the second local line LWL2 and the corresponding first local pad LP1, and, thereby, may couple the second local line LWL2 and the first local pad LP1.

The coupling pad CP1 may overlap with one of the second coupling lines CL2 of the first zone ZONE1 in the vertical direction VD. The contact M1C (see FIG. 6) and the contact M0C may be disposed at an overlapping region between the coupling pad CP1 and the second coupling line CL2, and thereby, may couple the coupling pad CP1 and the second coupling line CL2.

Referring to FIGS. 6 and 7E, a third coupling line CL3 may be disposed in a second top wiring layer M2. The third coupling line CL3 may extend in the second direction SD, and may overlap with the coupling pad CP1 in the vertical direction VD. The contact M2C may be defined at an overlapping region between the third coupling line CL3 and the coupling pad CP1, and the third coupling line CL3 may be coupled to the coupling pad CP1 through the contact M2C.

The third coupling line CL3 may be coupled to one of the second coupling lines CL2 of the first zone ZONE1 (see FIG. 7D) through the contact M2C, the coupling pad CP1, the contact M1C and the contact M0C.

Like the second coupling lines CL2 (see FIG. 7D) of the first zone ZONE1 (see FIG. 7D), the third coupling line CL3 may be used to transmit a signal that has a high possibility of causing a functional error of the memory device when the magnitude thereof decreases, for example, power and analog signals. As described above, the top wiring layer M2 is made of a conductive material that has a lower resistivity than the bottom wiring layers UM1 to UM3. By using the third coupling line CL3 to transmit a signal, such as a power and an analog signal, which is likely to cause a functional error of the memory device when the level thereof decreases, it is possible to suppress the occurrence of a functional error of the memory device.

No global lines are disposed in the first top wiring layer M1 and the second top wiring layer M2. The first top wiring layer M1 and the second top wiring layer M2 may be defined as layers in which the disposition of global lines is prohibited.

A high voltage may be loaded on the second local lines LWL2 depending on a memory operation state. The high voltage applied to the second local lines LWL2 may be higher than a voltage applied to the third coupling line CL3.

Because voltage driving ranges of the second local lines LWL2 and the third coupling line CL3 are different, the memory device may malfunction due to the coupling between the second local lines LWL2 and the third coupling line CL3. According to the present embodiment, because the disposition of global lines in the first top wiring layer M1 and the second top wiring layer M2 is prohibited, it is possible to reduce the number of top wiring layers required for the disposition of the second local lines LWL2. Accordingly, it is possible to prohibit local lines from being disposed in the second top wiring layer M2 in which the third coupling line CL3 is disposed, and it is possible to prohibit coupling lines from being disposed in the first top wiring layer M1 in which the second local lines LWL2 are disposed.

Therefore, it is possible to dispose the third coupling lines CL3 and the second local lines LWL2 in different top wiring layers. Accordingly, the coupling between coupling lines and local lines may be reduced, thereby contributing to suppressing a malfunction of the memory device due to coupling.

Figure 8:
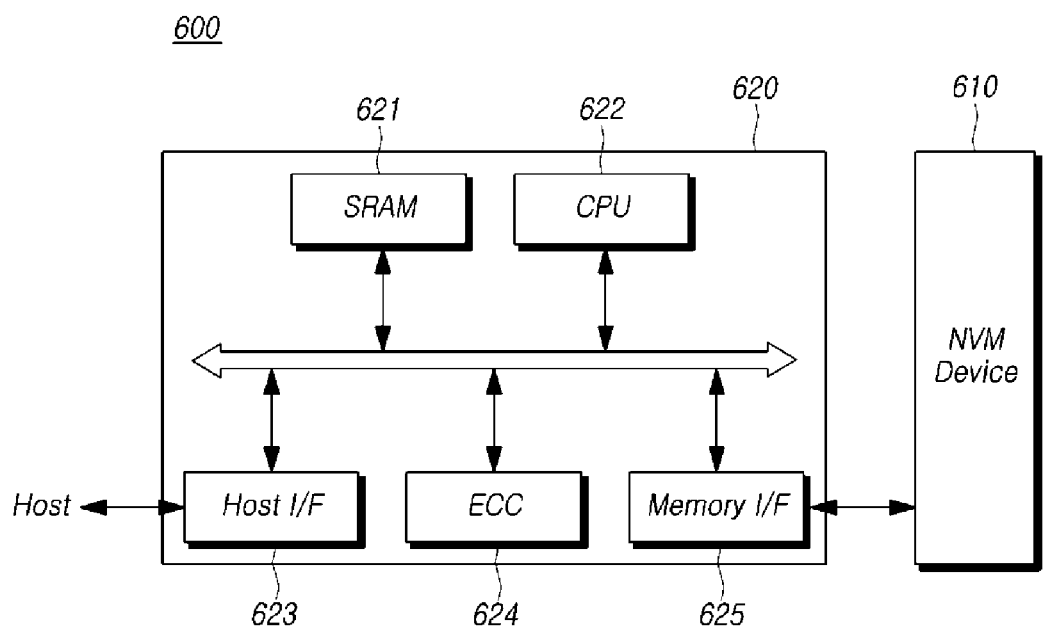
FIG. 8 is a block diagram schematically illustrating a representation of a memory system including a memory device in accordance with an embodiment of the disclosure.

FIG. 8 is a block diagram schematically illustrating a representation of a memory system including a memory device in accordance with an embodiment of the disclosure.

Referring to FIG. 8, a memory system 600 in accordance with an embodiment may include a nonvolatile memory device (NVM Device) 610 and a memory controller 620.

The nonvolatile memory device (NVM Device) 610 may be constituted by a memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 9:
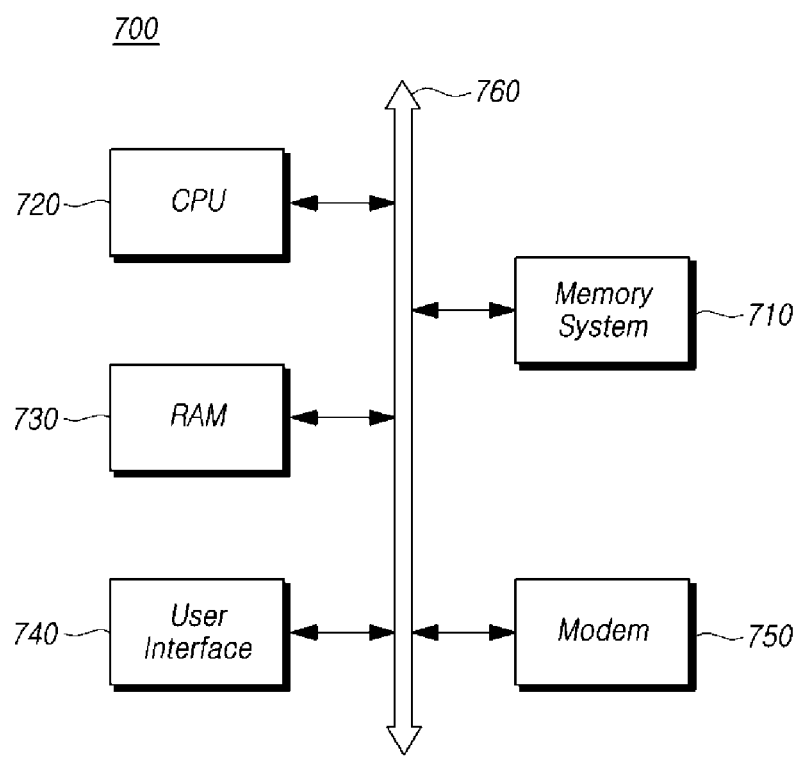
FIG. 9 is a block diagram schematically illustrating a representation of a computing system including a memory device in accordance with an embodiment of the disclosure.

FIG. 9 is a block diagram schematically illustrating a representation of a computing system including a memory device in accordance with an embodiment of the disclosure.

Referring to FIG. 9, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
a substrate defined with a first cell region and a second cell region, disposed in a first direction, and a row decoder region disposed between the first cell region and the second cell region;
a peripheral circuit defined in the first and second cell regions of the substrate;
a plurality of pass transistors defined in the row decoder region of the substrate;
a plurality of bottom wiring layers disposed in a first dielectric layer, which covers the peripheral circuit and the plurality of pass transistors;
a memory cell array defined on the first dielectric layer;
a second dielectric layer, defined on the first dielectric layer, that covers the memory cell array;
a plurality of top wiring layers disposed in a third dielectric layer, which is defined on the second dielectric layer; and
a plurality of global lines, disposed in the row decoder region, that transfer operating voltages to the plurality of pass transistors,
wherein the plurality of global lines are disposed only in a bottom wiring layer from among the plurality of bottom wiring layers and the plurality of top wiring layers.

2. The memory device according to claim 1, wherein the plurality of global lines are disposed in the bottom wiring layer that is not an uppermost bottom wiring layer from among the plurality of bottom wiring layers.

3. The memory device according to claim 2, wherein
the plurality of bottom wiring layers comprise a first bottom wiring layer, a second bottom wiring layer over the first bottom wiring layer, and a third bottom wiring layer over the second bottom wiring layer,
the third bottom wring layer is the uppermost bottom wiring layer,
the plurality of top wiring layers comprise a first top wiring layer and a second top wiring layer over the first top wiring layer, and
the plurality of global lines are disposed in the second bottom wiring layer.

4. The memory device according to claim 3, further comprising:
a plurality of local lines disposed in the row decoder region and configured to transfer the operating voltages provided through the plurality of pass transistors to the memory cell array,
wherein the plurality of local lines comprise:
a plurality of first local lines disposed in the second bottom wiring layer and electrically coupled respectively to the plurality of pass transistors; and
a plurality of second local lines disposed in the first top wiring layer and electrically coupled to the plurality of first local lines, respectively.

5. The memory device according to claim 4, further comprising:
a plurality of first local pads disposed in the row decoder region of the third bottom wiring layer, and coupled respectively to the first local lines through a plurality of first contacts,
wherein the memory cell array comprises a plurality of memory blocks,
wherein the plurality of pass transistors are grouped into a plurality of pass transistor groups respectively corresponding to the plurality of memory blocks, and
wherein first local pads, coupled to first local lines that are coupled to pass transistors included in one of the plurality of pass transistor groups, are arranged in a line in the first direction.

6. The memory device according to claim 5, wherein
each of the first cell region and the second cell region includes a plurality of peripheral regions that are arranged in a second direction,
the peripheral circuit is divided into the plurality of peripheral regions, elements included in the peripheral circuit are electrically coupled with one another through a plurality of coupling lines, and the plurality of coupling lines comprise:

a plurality of first coupling lines, disposed in the row decoder region of the second bottom wiring layer, that extend in the second direction;

a plurality of second coupling lines, disposed in the third bottom wiring layer, that extend in the first direction; and a third coupling line, disposed in the row decoder region of the second top wiring layer, that extends in the second direction, wherein the second direction is parallel to a top surface of the substrate and intersects with the first direction.

7. The memory device according to claim 6, wherein the local lines are disposed in the first top wiring layer and not disposed in the second top wiring layer, and the coupling lines are disposed in only the second top wiring layer and not disposed in the first top wiring layer.

8. The memory device according to claim 6, further comprising:

is a coupling pad, disposed in the row decoder region of the first top wiring layer, that is coupled to the third coupling line through a second contact; and a third contact passing through the second dielectric layer and coupling the coupling pad and one of the second coupling lines.

9. The memory device according to claim 8, wherein the plurality of second coupling lines comprise:

second coupling lines of a first group having a first width; and second coupling lines of a second group having a second width that is smaller than the first width, wherein the third contact couples the coupling pad and one of the second coupling lines of the first group.

10. The memory device according to claim 9, wherein the third bottom wiring layer includes a first zone and a second zone that are divided by a row of the first local pads disposed in the first direction, and the second coupling lines of the first group are disposed in the first zone, and the second coupling lines of the second group are disposed in the second zone.

11. The memory device according to claim 9, wherein the second coupling lines of the first group include a power line and an analog signal line, and the second coupling lines of the second group include logic signal lines.

12. A memory device comprising:

is a substrate, defined with a first plane region and a second plane region that are disposed in a first direction, and each of the first plane region and the second plane region includes a cell region and a row decoder region adjacent to the cell region in the first direction;

a plurality of pass transistors defined in the row decoder regions of the first plane region and the second plane region of the substrate;

a peripheral circuit defined in the cell regions of the first plane region and of the second plane region of the substrate;

a plurality of bottom wiring layers disposed in a first dielectric layer that covers the pass transistors and the peripheral circuit;

a memory cell array of a first plane, which is disposed on the first dielectric layer and is provided in the cell region of the first plane region, and a memory cell array of a second plane, which is disposed on the first dielectric layer and is provided in the cell region of the second plane region;

a second dielectric layer defined on the first dielectric layer and covering the memory cell arrays;

a plurality of top wiring layers disposed in a third dielectric layer, which is defined on the second dielectric layer; and a plurality of global lines disposed in the row decoder regions of the first plane region and the second plane region and configured to transfer operating voltages to the plurality of pass transistors, wherein the plurality of global lines are disposed only in at least one bottom wiring layer among the plurality of bottom wiring layers and the plurality of top wiring layers.

13. The memory device according to claim 12, wherein the plurality of global lines are disposed in at least one bottom wiring layer except for an uppermost bottom wiring layer from among the plurality of bottom wiring layers.

14. The memory device according to claim 13, wherein the plurality of bottom wiring layers comprise a first bottom wiring layer, a second bottom wiring layer over the first bottom wiring layer, and a third bottom wiring layer over the second bottom wiring layer, the third bottom wring layer is the uppermost bottom wiring layer, the plurality of top wiring layers comprise a first top wiring layer and a second top wiring layer over the first top wiring layer, and the plurality of global lines are disposed in the second bottom wiring layer.

15. The memory device according to claim 14, further comprising:

a plurality of local lines disposed in the row decoder regions of the first plane region and the second plane region and configured to transfer the operating voltages, provided through the plurality of pass transistors, to the memory cell arrays, wherein the plurality of local lines comprise:

a plurality of first local lines disposed in the second bottom wiring layer and electrically coupled to the plurality of pass transistors, respectively; and a plurality of second local lines disposed in the first top wiring layer and electrically coupled to the plurality of first local lines, respectively.

16. The memory device according to claim 15, further comprising:

a plurality of first local pads disposed in the row decoder regions of the third bottom wiring layer and coupled respectively to the first local lines through a plurality of first contacts, wherein each of the memory cell arrays comprises a plurality of memory blocks, wherein the plurality of pass transistors are grouped into a plurality of pass transistor groups corresponding to the plurality of memory blocks, respectively, and wherein, among the plurality of first local pads, first local pads, coupled with first local lines that are coupled to pass transistors included in one of the plurality of pass transistor groups, are disposed in a line in the first direction.

17. The memory device according to claim 16, wherein each of the cell regions of the first plane region and the second plane region includes a plurality of peripheral regions that are arranged in a second direction that is parallel to a top surface of the substrate and intersects with the first direction, is the peripheral circuit is disposed in the plurality of peripheral regions, elements included in the peripheral circuit are electrically coupled with one another through a plurality of coupling lines, and the plurality of coupling lines comprise:

a plurality of first coupling lines disposed in the row decoder region of the second bottom wiring layer and extending in the second direction;

a plurality of second coupling lines disposed in the third bottom wiring layer and extending in the first direction; and a third coupling line disposed in the row decoder region of the second top wiring layer and extending in the second direction.

18. The memory device according to claim 17, further comprising:

a coupling pad disposed in the row decoder region of the first top wiring layer and coupled to the third coupling line through a second contact; and a third contact passing through the second dielectric layer and coupling the coupling pad and one of the plurality of second coupling lines.

19. The memory device according to claim 18, wherein the plurality of second coupling lines comprise:

second coupling lines of a first group having a first width; and second coupling lines of a second group having a second width that is smaller than the first width, wherein the third contact couples the coupling pad and one of the second coupling lines of the first group, and wherein the second coupling lines of the first group include a power line and an analog signal line, and the second coupling lines of the second group include logic signal lines.

20. The memory device according to claim 19, wherein the third bottom wiring layer includes a first zone and a second zone, which are divided by a row of the first local pads disposed in the first direction, and the second coupling lines of the first group are disposed in the first zone, and the second coupling lines of the second group are disposed in the second zone.

\* \* \* \* \*